United States Patent
Kuo et al.

(10) Patent No.: US 11,664,792 B1
(45) Date of Patent: May 30, 2023

(54) ELECTRONIC DEVICE AND DATA TRANSMISSION PROTECTION DEVICE THEREOF

(71) Applicant: ASPEED Technology Inc., Hsinchu (TW)

(72) Inventors: Chin-Ting Kuo, Hsinchu (TW); Chih-Chiang Mao, Hsinchu (TW)

(73) Assignee: ASPEED Technology Inc., Hsinchu (TW)

( * ) Notice: Subject to any disclaimer, the term of this patent is extended or adjusted under 35 U.S.C. 154(b) by 0 days.

(21) Appl. No.: 17/830,365

(22) Filed: Jun. 2, 2022

(30) Foreign Application Priority Data

Apr. 8, 2022 (TW) .................................. 111113398

(51) Int. Cl.
*H03K 5/135* (2006.01)
*H03K 19/003* (2006.01)
*H03K 19/20* (2006.01)

(52) U.S. Cl.
CPC .......... *H03K 5/135* (2013.01); *H03K 19/003* (2013.01); *H03K 19/20* (2013.01)

(58) Field of Classification Search
None
See application file for complete search history.

(56) References Cited

U.S. PATENT DOCUMENTS

| | | |
|---|---|---|
| 7,590,880 B1 | 9/2009 | Hershman |
| 8,601,273 B2 | 12/2013 | Schluessler et al. |
| 10,637,452 B2 * | 4/2020 | Park .......................... G06F 1/10 |
| 2016/0306975 A1 | 10/2016 | Schmidt et al. |
| 2021/0119618 A1 * | 4/2021 | Wei ....................... H03L 7/0991 |

FOREIGN PATENT DOCUMENTS

| | | |
|---|---|---|
| TW | 200949687 | 12/2009 |
| TW | 202125525 | 7/2021 |

* cited by examiner

*Primary Examiner* — Cassandra F Cox
(74) *Attorney, Agent, or Firm* — JCIPRNET

(57) ABSTRACT

An electronic device and data transmission protection device thereof are provided. The data transmission protection device includes an input clock signal detector and a control signal generator. The input clock signal detector receives a reference clock signal, and detects a frequency of an input clock signal provided by a host end according to the reference clock signal, and frequencies of the reference clock signal and the input clock signal are different. The control signal generator enables a generated control signal when the frequency of the input clock signal is larger than a safety setting value. The control signal is used to disable the host end to perform a data accessing operation on a protected circuit.

20 Claims, 6 Drawing Sheets

ELECTRONIC DEVICE AND DATA TRANSMISSION PROTECTION DEVICE THEREOF

CROSS-REFERENCE TO RELATED APPLICATION

This application claims the priority benefit of Taiwan application serial no. 111113398, filed on Apr. 8, 2022. The entirety of the above-mentioned patent application is hereby incorporated by reference herein and made a part of this specification.

BACKGROUND

Technology Field

The disclosure relates to an electronic device and a data transmission protection device thereof, and particularly, to an electronic device and a data transmission protection device thereof capable of protecting against overclocking attacks.

Description of Related Art

In electronic devices, the security of data transmission has always been an important issue. Taking the platform firmware resilience (PFR) mechanism as an example, attackers can perform an overclocking attack on a protected circuit by providing the serial peripheral interface (SPI) of the protected circuit with an overclocked input clock signal.

In the subsequent paragraphs, referring to a schematic view of waveforms of an overclocking attack illustrated in FIG. 1, an attacker can provide the protected circuit with an overlocked input clock signal INCK. Based on the platform firmware resilience mechanism, the allowable sampling frequency has an upper limit, when the frequency of the input clock signal INCK is too high, the platform firmware resilience mechanism can limit the upper limit of the frequency of the sampling clock signal SCK, but the input clock signal INCK is still allowed to be transmitted to the protected circuit. Accordingly, based on the overclocked input clock signal INCK, the attacker can transmit the unallowable data to the protected circuit through the general data DATA.

SUMMARY

The disclosure provides an electronic device and a data transmission protection device thereof capable of effectively performing the protection from overclocking attacks.

The data transmission protection device of the disclosure includes an input clock signal detector and a control signal generator. The input clock signal detector receives a reference clock signal and detects a frequency of an input clock signal provided by a host end according to the reference clock signal. A frequency of the reference clock signal and the frequency of the input clock signal are not the same. The control signal generator is coupled to the input clock signal detector and enables a generated control signal when the frequency of the input clock signal is greater than a safety setting value. The control signal is used to disable the host end to perform a data access operation on a protected circuit.

The electronic device of the disclosure includes a protected circuit and a data transmission protection device. The data transmission protection device is coupled between a host end and the protected circuit. The data transmission protection device includes an input clock signal detector and a control signal generator. The input clock signal detector receives a reference clock signal and detects a frequency of an input clock signal provided by a host end according to the reference clock signal. A frequency of the reference clock signal and the frequency of the input clock signal are not the same. The control signal generator is coupled to the input clock signal detector and enables a generated control signal when the frequency of the input clock signal is greater than a safety setting value. The control signal is used to disable the host end to perform a data access operation on a protected circuit.

In summary, the data transmission protection device of the disclosure performs the detection of the frequency of the input clock signal based on the reference clock signal. Moreover, when the frequency of the input clock signal is greater than the safety setting value, the data access operation performed by the host end on the protected circuit is closed, which can effectively achieve the protection operation from overclocking attacks.

DESCRIPTION OF THE EMBODIMENTS

Figure 2:
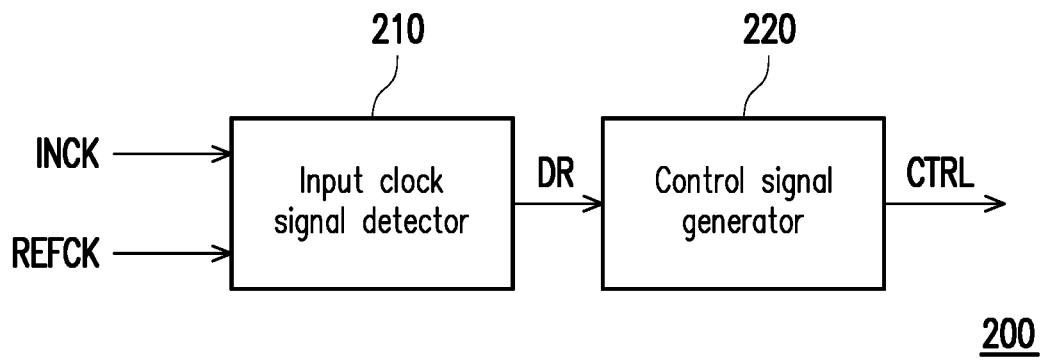
FIG. 2 is a schematic view of a data transmission protection device according to an embodiment of the disclosure.

Referring to FIG. 2, FIG. 2 is a schematic view illustrating a data transmission protection device according to an embodiment of the disclosure. A data transmission protection device 200 includes an input clock signal detector 210 and a control signal generator 220. The input clock signal detector 210 receives the input clock signal INCK provided by the host end (not shown) and receives a reference clock signal REFCK. The input clock signal detector 210 detects the frequency of the input clock signal INCK provided by the host end according to the reference clock signal REFCK to generate a detection result DR, and the frequency of the reference clock signal REFCK is different from the frequency of the input clock signal INCK.

The control signal generator 220 is coupled to the input clock signal detector 210. The control signal generator 220 receives the detection result DR generated by the input clock signal detector 210. The control signal generator 220 enables a control signal CTRL generated by the control signal generator 220 when the frequency of the input clock signal INCK is greater than a safety setting value. The control signal generator 220 can provide the protected circuit (not shown) in the subsequent stage with the control signal CTRL and disable the data access operation performed by the host end on the protected circuit. The data access operations include general data access operations and may also include command data access operations.

In the embodiment of the disclosure, when the input clock signal detector 210 detects that the frequency of the input clock signal INCK is greater than the safety setting value, the control signal generator 220 can use the control signal CTRL generated by the control signal generator 220 to enable the protected circuit to inhibit the external data access operations, external overclocking attacks can be effectively prevented, and the security of the system is ensured.

In other embodiments of the disclosure, the control signal generator 220 can also provide the host end with the control signal CTRL, and through the enabled control signal CTRL the host end is enabled to perform a reset operation, so as to further stop the host end from continuing to send abnormal input clock signals INCK.

Figure 3A:
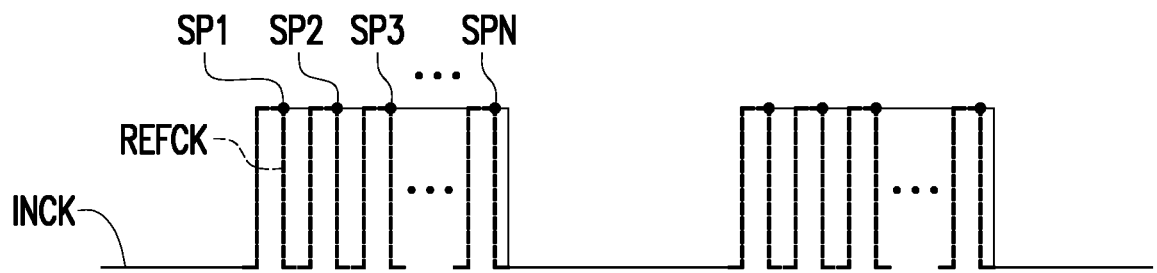
FIG. 3A and FIG. 3B are schematic views illustrating the detection of the frequency of an input clock signal according to an embodiment of the disclosure.
Figure 3B:
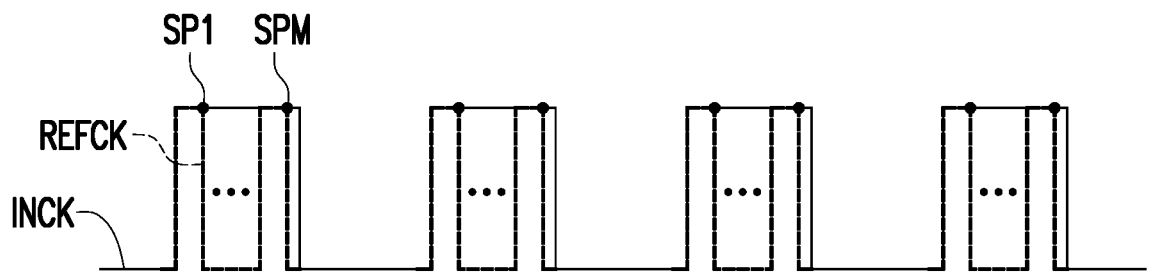

In the subsequent paragraphs, referring to FIG. 2, FIG. 3A and FIG. 3B, FIG. 3A and FIG. 3B are schematic views illustrating the detection of the frequency of an input clock signal according to an embodiment of the disclosure. In FIG. 3A, the frequency of the reference clock signal REFCK received by the input clock signal detector 210 is higher than the frequency of the input clock signal INCK. The input clock signal detector 210 can sample the input clock signal INCK according to the reference clock signal REFCK. In FIG. 3A, the input clock signal detector 210 can sample the positive pulse wave of the input clock signal INCK according to the falling edge of the reference clock signal REFC and obtain multiple sampling points SP1 to SPN. The input clock signal detector 210 can calculate the number of sampling points SP1 to SPN to obtain sampling values (e.g., equal to N) and generate the sampling result DR according to the sampling values.

The control signal generator 220 can compare the sampling value with a preset reference value according to the sampling result DR. When the sampling value is greater than or equal to the reference value, it means that the frequency of the input clock signal INCK is not higher than the safety setting value and is a normal signal. The control signal generator 220 generates the disabled control signal CTRL correspondingly and enables the protected circuit to perform normal data access operations.

In FIG. 3B, the input clock signal detector 210 also samples the positive pulse wave of the input clock signal INCK according to the falling edge of the reference clock signal REFCK and obtains multiple sampling points SP1 to SPM. The input clock signal detector 210 obtains sampling values (e.g., equal to M) according to the number of the sampling points SP1 to SPM. Under the condition that the sampling value (=M) is less than the reference value, the control signal generator 220 can acquire that the frequency of the input clock signal INCK has exceeded the safety setting value and correspondingly generate the enabled control signal CTRL to enable the protected circuit to inhibit the execution of data access operations.

Note that, in the embodiment, the input clock signal detector 210 can also use the rising edge of the reference clock signal REFCK to sample the input clock signal INCK without any limitation. Moreover, when the duty cycle of the input clock signal INCK is 50%, the input clock signal detector 210 may sample the positive or negative pulse of the input clock signal INCK. Alternatively, when the duty cycle of the input clock signal INCK is not 50%, the input clock signal detector 210 may sample a complete cycle (a continuous positive pulse and a negative pulse) of the input clock signal INCK. Accordingly, the accuracy of the obtained detection result DR can be effectively ensured.

Figure 4:
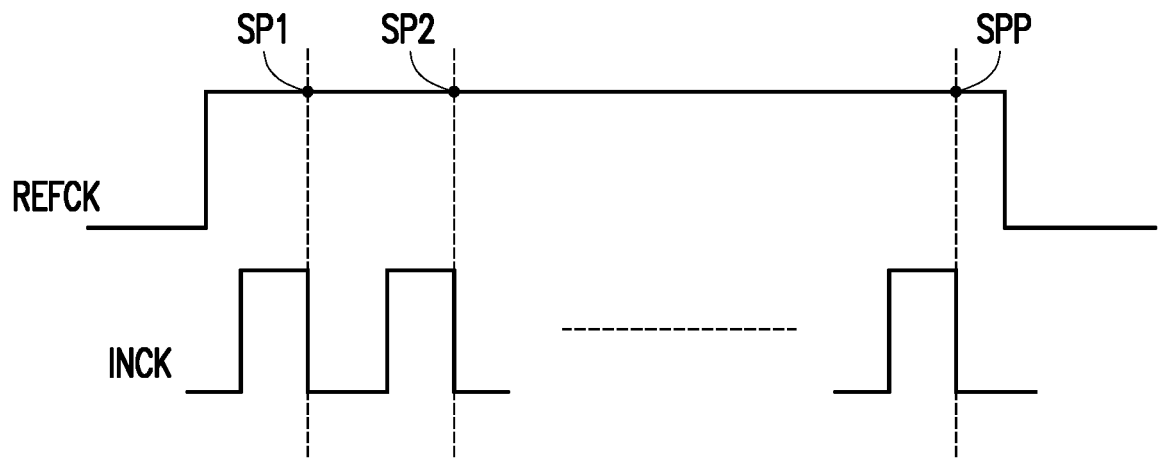
FIG. 4 is a schematic view illustrating another implementation of the detection of the frequency of the input clock signal according to the embodiment of the disclosure.

In the subsequent paragraphs, referring to FIG. 2 and FIG. 4, FIG. 4 is a schematic view illustrating another implementation of the detection of the frequency of the input clock signal according to the embodiment of the disclosure. In FIG. 4, the frequency of the input clock signal INCK may be higher than the frequency of the reference clock signal REFCK. The input clock signal detector 210 can set the length of the positive pulse of the reference clock signal REFCK to set the detection interval of the frequency of the input clock signal INCK, the positive pulse wave of the reference clock signal REFCK is sampled according to the transition edge (e.g., the falling edge) of the input clock signal INCK, and multiple sampling points SP1 to SPP are obtained. The input clock signal detector 210 can generate sampling values according to the number (e.g., equal to P) of sampling points SP1 to SPP, and the control signal generator 220 compares the sampling values with the reference value and generates the control signal CTRL accordingly.

Different from the previous embodiment, in the embodiment, when the sampling value is greater than the reference value, it means that the frequency of the input clock signal INCK is higher than the safety setting value. Under such a condition, the control signal generator 220 can enable the generated control signal CTRL and disable the data access operation of the protected circuit. On the contrary, when the sampling value is not greater than the reference value, it means that the frequency of the input clock signal INCK is not higher than the safety setting value. Under such a condition, the control signal generator 220 can disable the generated control signal CTRL and enable the data access operation of the protected circuit to operate normally.

Note that, in the embodiment of the disclosure, the frequency detection performed by the input clock signal detector 210 does not need to be performed until the time point when the positive pulse of the reference clock signal REFCK ends. In fact, when the input clock signal detector 210 calculates that the accumulated number of the sampling points SP1 to SPP is greater than the reference value, it can be determined that the input clock signal INCK is an abnormal signal. Meanwhile, the input clock signal detector 210 can immediately stop the frequency detection and output the detection result DR indicating that the sampling value is greater than the reference value.

In the embodiment, the designer can set the length of the positive pulse wave of the reference clock signal REFCK according to a safety setting value of the frequency of the input clock signal INCK.

Note that in the implementations of FIG. 3A, FIG. 3B, and FIG. 4, the sampling operation between the input clock signal INCK and the reference clock signal REFCK can be completed through a D-type flip-flop, and the calculation of the sampling point can be performed using a digital counter circuit. In addition, the comparison between the sampling value and the reference value performed by the control signal generator 220 can be performed by using a comparator of a digital circuit without fixed limitation on the hardware structure.

Figure 5A:
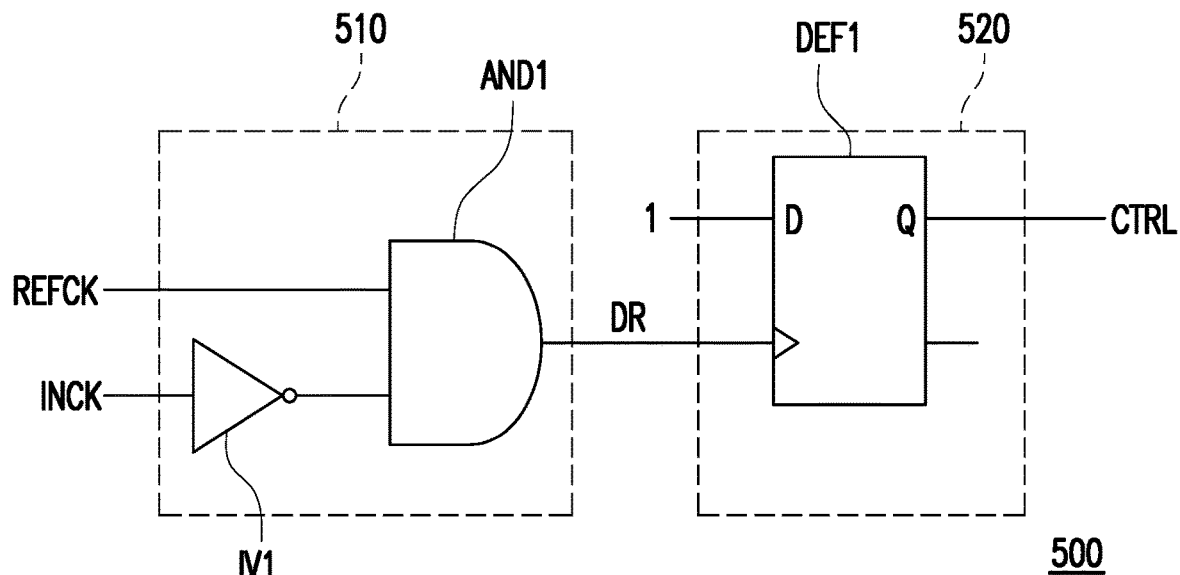
FIG. 5A is a schematic view of a data transmission protection device according to an embodiment of the disclosure.
Figure 5B:
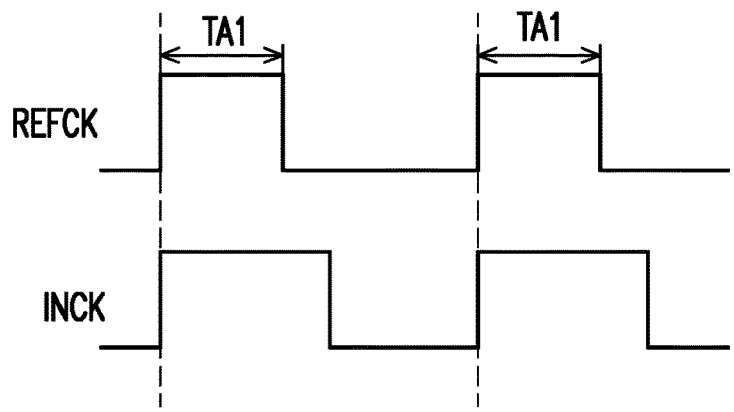
FIG. 5B and FIG. 5C are diagrams illustrating waveforms of the operations of a data transmission protection device 500 according to the embodiment of FIG. 5A.
Figure 5C:
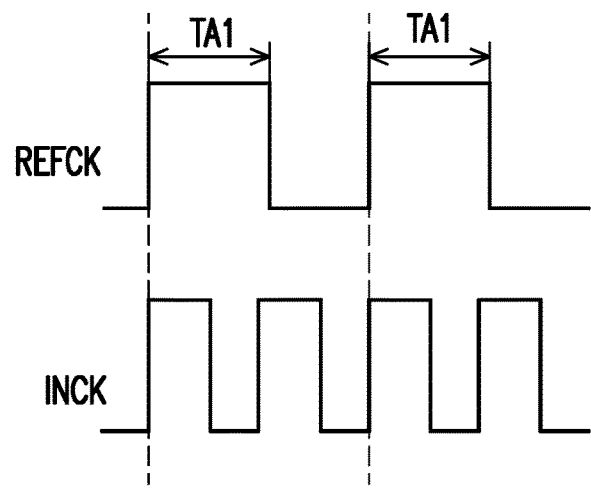

In the subsequent paragraphs, referring to FIG. 5A to FIG. 5C, FIG. 5A is a schematic view of a data transmission protection device according to an embodiment of the disclosure, and FIG. 5B and FIG. 5C are diagrams illustrating waveforms of the operations of a data transmission protection device 500 according to the embodiment of FIG. 5A. In FIG. 5A, the protection device 500 includes an input clock signal detector 510 and a control signal generator 520. The input clock signal detector 510 is a logic operation circuit and configured for performing logic operations on the input clock signal INCK and the reference clock signal REFCK and generates the detection result DR accordingly. The control signal generator 520 receives the detection result DR and generates the control signal CTRL according to the detection result DR.

In the embodiment, the input clock signal detector 510 includes an AND gate AND1 and an inverter IV1. The input terminal of the inverter IV1 receives the input clock signal INCK. One input terminal of the AND gate AND1 receives the reference clock signal REFCK, and another input terminal of the AND gate AND1 is coupled to the output terminal of the inverter IV1 to receive an inverse signal of the input clock signal INCK. The AND gate AND1 can perform an AND logic operation on the inverse signal of the input clock signal INCK and the reference clock signal REFCK to generate the detection result DR. The control signal generator 520 is a D-type flip-flop DFF1. The clock terminal of the D-type flip-flop DFF1 receives the detection result DR; the data terminal D of the D-type flip-flop DFF1 receives a signal of logic value 1; the output terminal Q of the D-type flip-flop DFF1 generates the control signal CTRL. In the embodiment, in the initial state, the control signal generated by the output terminal Q of the D-type flip-flop DFF1 may be a logic value of 0.

In the subsequent paragraphs, referring to both FIG. 5A and FIG. 5B, positive pulse width TA1 of the reference clock signal REFCK can be set according to a safety setting value of the frequency of the input clock signal INCK. For example, if the safety setting value of the frequency of the input clock signal INCK is 50 MHz (the period is 20 nanoseconds (ns)), the positive pulse width TA1 of the reference clock signal REFCK can be set as half of the period (10 ns) of the input clock signal INCK.

In FIG. 5B, when the frequency of the input clock signal INCK is not greater than the safety setting value, the detection result DR generated by the AND gate AND1 is constantly maintained at the logic value 0 and its state does not transit. Therefore, the D-type flip-flop DFF1 is not activated and keeps the control signal CTRL constantly equal to logic 0. Accordingly, the data access operation of the protected circuit can operate normally.

In contrast, in FIG. 5C, when the frequency of the input clock signal INCK is greater than the safety setting value, the detection result DR generated by the AND gate AND1 can periodically transit between the logic value 1 and the logic value 0. Therefore, the D-type flip-flop DFF1 can be activated and the control signal CTRL is transited to a logic value of 1. Accordingly, the data access operation of the protected circuit can be inhibited.

Figure 1:
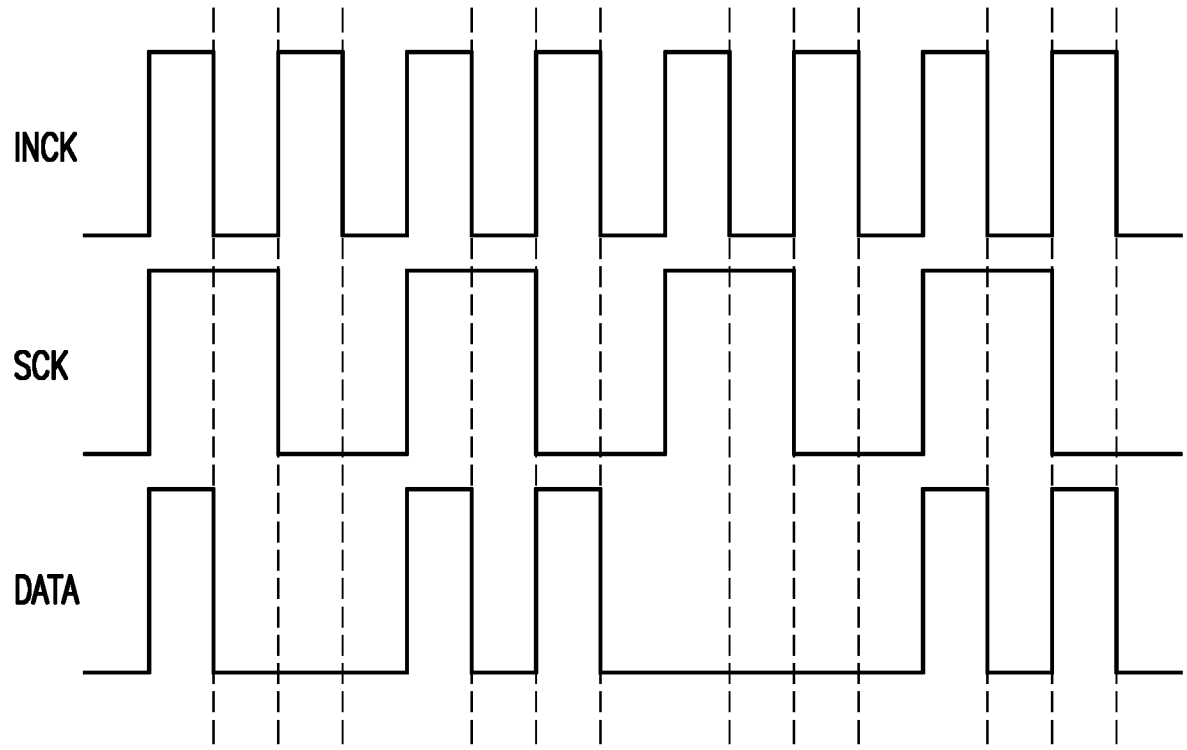
FIG. 1 is a schematic view of waveforms of an overclocking attack.
Figure 6:
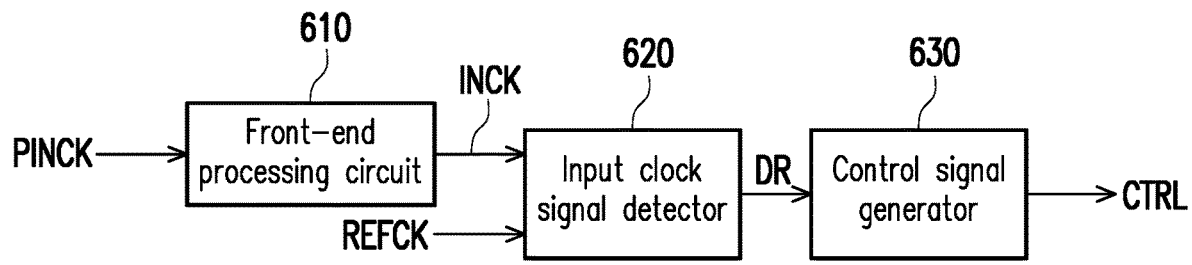
FIG. 6 is a schematic view illustrating a data transmission protection device according to another embodiment of the disclosure.

In the subsequent paragraphs, referring to FIG. 6, FIG. 6 is a schematic view illustrating a data transmission protection device according to another embodiment of the disclosure. A data transmission protection device 600 includes a front-end processing circuit 610, an input clock signal detector 620, and a control signal generator 630. What differs from the embodiment in FIG. 1 is that in the data transmission protection device 600, the front-end processing circuit 610 is additionally disposed at the front-end of the input clock signal detector 620. The front-end processing circuit 610 may perform front-end processing operations on a pre-processed input clock signal PINCK and transmit the generated processed input clock signal INCK to the input clock signal detector 620.

The front-end processing circuit 610 can be a frequency divider, for example. Regardless of the duty cycle of the pre-processed input clock signal PINCK, the front-end processing circuit 610 can provide the input clock signal detector 620 with the input clock signal INCK with a duty cycle of 50% and can also ensure the accuracy of the detection result DR generated by the input clock signal detector 620.

Figure 7A:
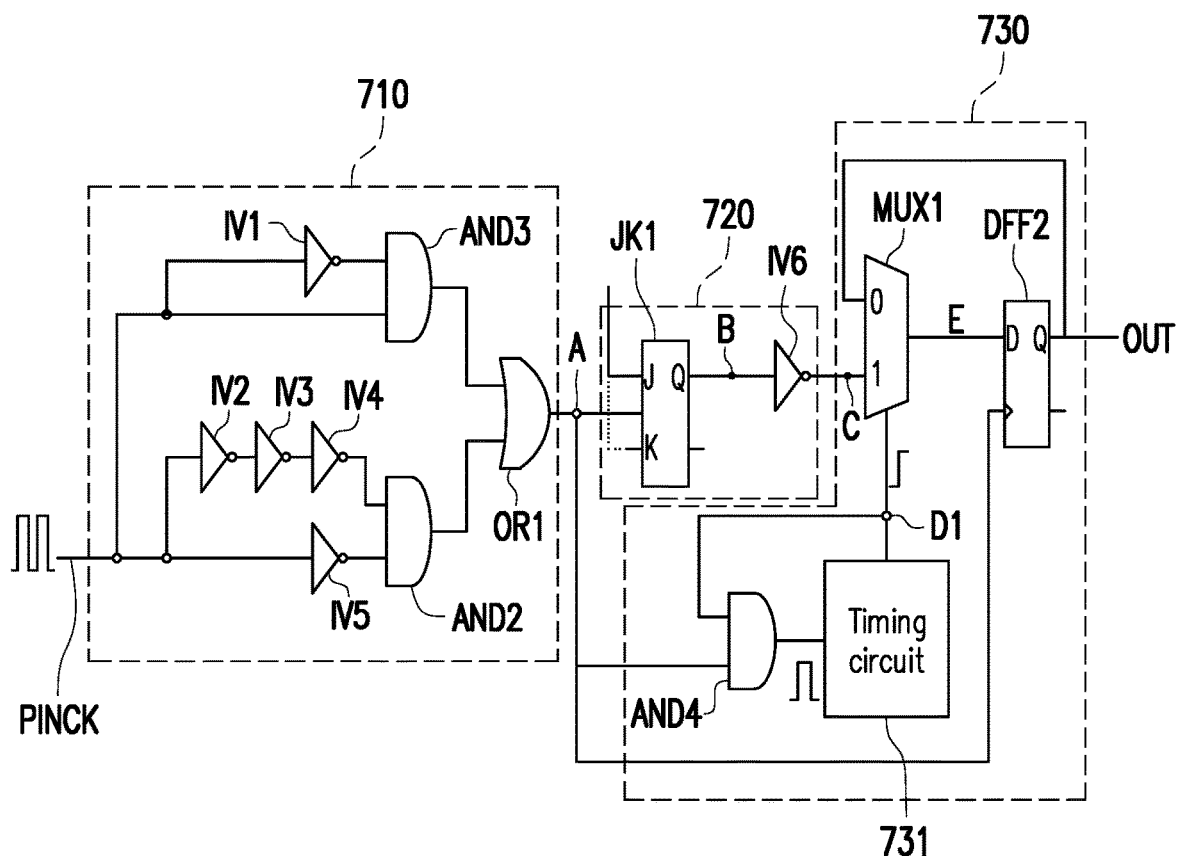
FIG. 7A to FIG. 7C are schematic views illustrating the implementations of circuits and waveforms of the front-end processing circuit in the data transmission protection device according to an embodiment of the disclosure.
Figure 7B:
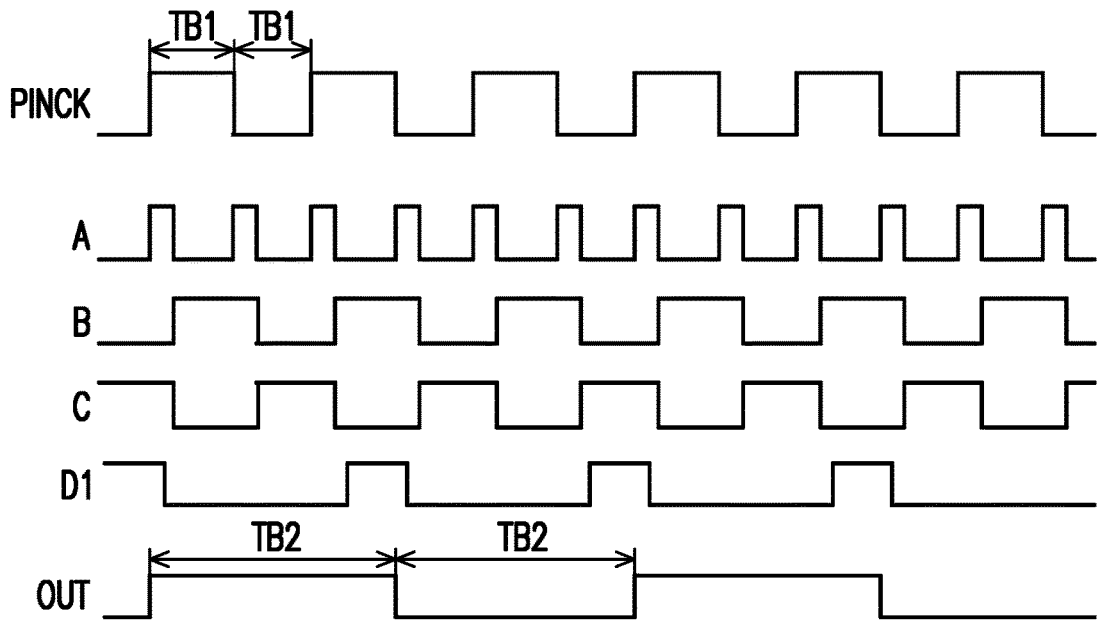
Figure 7C:
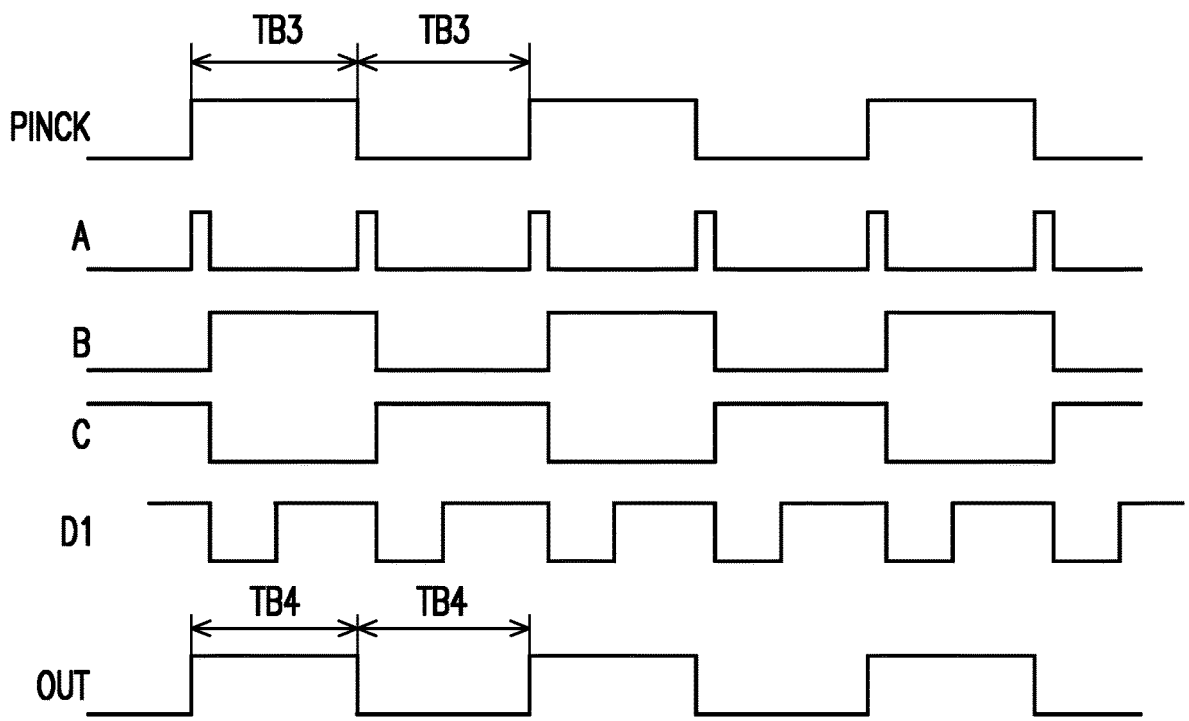

The front-end processing circuit 610 can also determine whether to reduce the frequency of the pre-processed input clock signal PINCK to generate the input clock signal INCK according to the frequency of the pre-processed input clock signal PINCK. For implementation details, refer to FIG. 7A to 7C. FIG. 7A to FIG. 7C are schematic views illustrating the implementations of circuits and waveforms of the front-end processing circuit in the data transmission protection device according to an embodiment of the disclosure.

In FIG. 7A, a front-end processing circuit 700 includes a transition edge detector 710, a frequency divider 720, and an output controller 730. The transition edge detector 710 receives the pre-processed input clock signal PINCK and is configured for detecting the transition edge of the pre-processed input clock signal PINCK to generate a signal A. The frequency divider 720 is coupled to the transition edge detector 710 for receiving the signal A and divides the frequency of the signal A to generate a signal B. The output controller 730 is coupled to the transition edge detector 710 and the frequency divider 720 for initiating a timing operation according to the signal A. According to an overflow result D1 of the timing operation, a signal C (an inverse signal of the signal B) or a previous output signal POUT is selected to generate a signal E, and based on the activation of the signal A, a current output signal OUT is generated according to the signal E. The current output signal OUT can be sent to the input clock signal detector 620 as the input clock signal INCK.

The transition edge detector 710 includes inverters IV1 to IV5, an AND gate AND2, an AND gate AND3, and an OR gate OR1. The inverter IV1 and the AND gate AND3 form a one-shot circuit and generate a first pulse signal according to the rising edge of the pre-processed input clock signal PINCK. The inverters IV2 to IV5 and the AND gate AND2 form another one-shot circuit and generate a second pulse signal according to the falling edge of the pre-processed input clock signal PINCK. The OR gate OR1 combines the first pulse signal and the second pulse signal to generate the signal A.

The frequency divider 720 includes a JK flip-flop JK1 and an inverter IV6. Both the J terminal and the K terminal of the JK flip-flop JK1 receive a signal with a logic value of 1 and form a T-type flip-flop structure. The clock terminal of the JK flip-flop JK1 receives the signal A and divides the frequency of the signal A to generate the signal B at the output terminal Q. The inverter IV6 inverts signal B to generate signal C.

The output controller 730 includes a timing circuit 731, a multiplexer MUX1, an AND gate AND4, and a D-type flip-flop DFF2. The 0 input terminal of the multiplexer MUX1 receives the previous output signal POUT; the 1 input terminal of the multiplexer MUX1 receives the signal C; the multiplexer MUX1 is controlled by the overflow signal D generated by the timing circuit 731. The AND gate AND4 receives the overflow signal D and the signal A, and the output signal of the AND gate AND4 is used to start the timing operation of the timing circuit 731. The data terminal D of the D-type flip-flop DFF2 receives the signal E and according to the activation of the signal A, generates the current output signal OUT at the output terminal according to the signal E.

Note that taking the safety setting value of 50 MHz as an example, the timing operation performed by the timing circuit 731 can be set to generate an overflow phenomenon when the timing operation reaches 10 ns, and the overflow signal D of the logic value 1 is generated accordingly.

In the subsequent paragraphs, refer to both FIG. 7A and FIG. 7B. In FIG. 7B, when the frequency of the pre-processed input clock signal PINCK is greater than the safety setting value, the positive and negative pulse waves of the pre-processed input clock signal PINCK have a relatively small wave width TB1 (e.g. equal to 8 ns). Through the operations of the transition edge detector 710, the frequency divider 720, and the output controller 730, a positive and negative pulse width TB2 of the current output signal OUT generated by the output controller 730 can be increased, for example, greater than or equal to 10 ns. Accordingly, when the frequency of the pre-processed input clock signal PINCK is greater than the safety setting value, the front-end processing circuit 700 can effectively reduce the frequency of the pre-processed input clock signal PINCK and ensure that the clock signal received by the clock signal detector is processable.

In the subsequent paragraphs, refer to both FIG. 7A and FIG. 7C. In FIG. 7C, when the frequency of the pre-processed input clock signal PINCK is not greater than the safety setting value, the positive and negative pulse waves of the pre-processed input clock signal PINCK have a relatively large wave width TB3 (e.g. equal to 20 ns). Through the operations of the transition edge detector 710, the frequency divider 720, and the output controller 730, a positive and negative pulse width TB4 of the current output signal OUT that can be generated by the output controller 730 may be similar to the pulse width TB3 without generating mass transit.

According to the foregoing description, it is not difficult to know that the front-end processing circuit 700 of the embodiment of the disclosure can control the pulse width of the input clock signal INCK to a certain range. Accordingly, the setting operation of the frequency (the pulse width) of the reference clock signal REFCK can be performed more easily. The designer can set the reference clock signal REFCK which is more suitable for sampling the input clock signal INCK (or for being sampled by the input clock signal INCK), and the accuracy of the frequency detection of the input clock signal INCK is effectively improved.

Figure 8A:
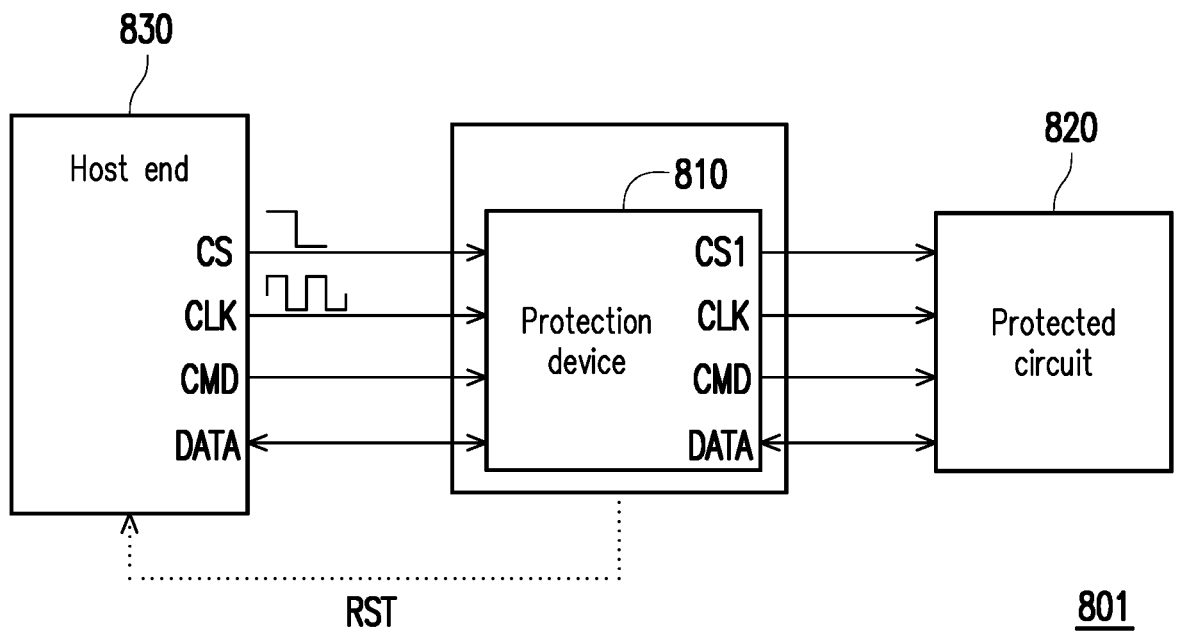
FIG. 8A and FIG. 8B are schematic views of different implementations of an electronic device according to an embodiment of the disclosure, respectively.
Figure 8B:
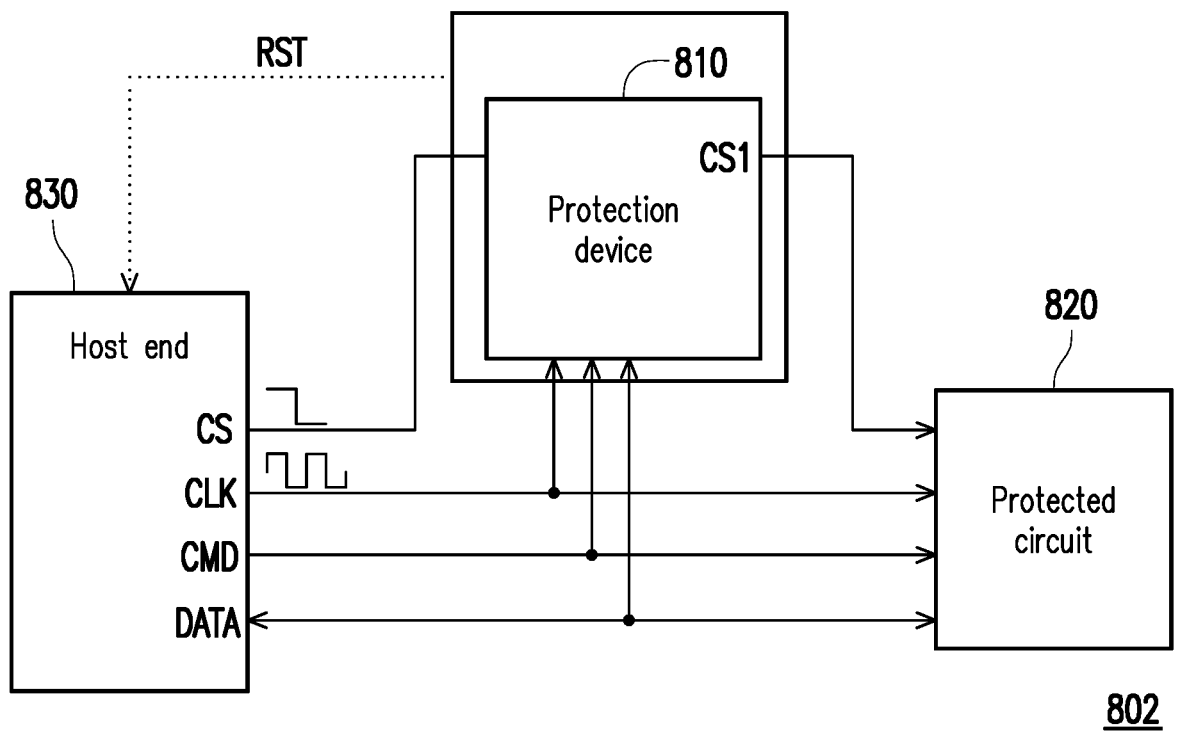

In the subsequent paragraphs, referring to FIG. 8A and FIG. 8B, FIG. 8A and FIG. 8B are schematic views of different implementations of an electronic device according to an embodiment of the disclosure, respectively. In FIG. 8A, an electronic device 801 includes a protection device 810 and a protected circuit 820. The protection device 810 is coupled between a host end 830 and the protected circuit 820. The host end 830 is not directly connected to the protected circuit 820. The host end 830 also transmits a chip enable signal CS, a clock signal CLK, command data CMD, and general data DATA to the protection device 810. The protection device 810 receives the clock signal CLK as an input clock signal and generates a control signal by judging the frequency of the clock signal CLK. In the embodiment, the protection device 810 can use the generated control signal as a chip enable signal CS1 of the protected circuit 820. The protection device 810 can enable or disable the chip enable signal CS1 to enable the protected circuit 820 to start or stop the data access operation.

In the embodiment, the protected circuit 820 may be any form of memory or circuit with no specific limitation.

Moreover, the clock signal CLK, the command data CMD, and the general data DATA sent by the host end 830 can be transmitted to the protected circuit 820 through the protection device 810. When the frequency of the clock signal CLK exceeds the safety setting value, the protection device 810 can stop the operation of the protected circuit 820 through the chip enable signal CS1. The clock signal CLK, the command data CMD, and the general data DATA received by the protected circuit 820 do not cause security concerns.

On the other hand, the protection device 810 may further generate a reset signal RST according to the control signal. The protection device 810 may transmit the reset signal RST to the host end 830 to perform a reset operation for the host end 830.

In FIG. 8B, the electronic device 802 includes the protection device 810 and the protected circuit 820. The protection device 810 is coupled between the host end 830 and the protected circuit 820. What differs from the embodiment of FIG. 8A is that in the electronic device 802, the host end 830 can directly perform the transmission of the clock signal CLK, the command data CMD, and the general data DATA with the protected circuit 820.

Similar to the embodiment of FIG. 8A, in FIG. 8B, the protection device 810 receives the clock signal CLK as the input clock signal and generates the control signal by judging the frequency of the clock signal CLK. In the embodiment, the protection device 810 can use the generated control signal as the chip enable signal CS1 of the protected circuit 820. The protection device 810 can enable or disable the chip enable signal CS1 to enable the protected circuit 820 to start or stop the data access operation.

Meanwhile, the protection device 810 can further generate the reset signal RST according to the control signal. The protection device 810 may transmit the reset signal RST to the host end 830 to perform a reset operation for the host end 830.

In the embodiment, the protection device 810 may be a platform firmware resilience (PFR) circuit.

In summary, the data transmission protection device of the disclosure detects whether the frequency of the input clock signal is higher than a safety setting value by detecting the frequency of the input clock signal. Moreover, when the frequency of the input clock signal is higher than the safety setting value, the data access operation of the protected circuit is disabled through the generated control signal. Accordingly, the protected circuit can be protected from overclocking attacks and the normal operation of the system can be ensured.

What is claimed is:
1. A data transmission protection device, comprising:
an input clock signal detector receiving a reference clock signal and detecting a frequency of an input clock signal provided by a host end according to the reference clock signal, wherein a frequency of the reference clock signal and the frequency of the input clock signal are not the same; and a control signal generator coupled to the input clock signal detector and enabling a generated control signal when the frequency of the input clock signal is greater than a safety setting value, wherein the control signal is used to disable the host end to perform a data access operation on a protected circuit.

2. The data transmission protection device according to claim 1, wherein the frequency of the reference clock signal is higher than the frequency of the input clock signal, the input clock signal detector samples the input clock signal according to the reference clock signal to generate a sampling value, and the control signal generator compares a preset reference value with the sampling value to generate the control signal.

3. The data transmission protection device according to claim 2, wherein the input clock signal detector samples at least one pulse of the input clock signal according to the reference clock signal to generate the sampling value.

4. The data transmission protection device according to claim 3, wherein when the sampling value is less than the reference value, the control signal generator enables the control signal.

5. The data transmission protection device according to claim 1, wherein the frequency of the reference clock signal is lower than the frequency of the input clock signal, the input clock signal detector samples the reference clock signal according to the input clock signal to generate a sampling value, and the control signal generator compares a preset reference value with the sampling value to generate the control signal.

6. The data transmission protection device according to claim 5, wherein the input clock signal detector samples at least one pulse of the reference clock signal according to the input clock signal to generate the sampling value.

7. The data transmission protection device according to claim 6, wherein when the sampling value is greater than the reference value, the control signal generator enables the control signal.

8. The data transmission protection device according to claim 1, wherein the input clock signal detector performs a logic operation on the reference clock signal and the input clock signal to generate a detection result, and the control signal generator generates the control signal according to the detection result.

9. The data transmission protection device according to claim 8, wherein the input clock signal detector performs an AND logic operation on an inverse signal of the input clock signal and the reference clock signal to generate the detection result.

10. The data transmission protection device according to claim 8, wherein the control signal generator is a D-type flip-flop, and the D-type flip-flop is activated according to the detection result to enable the generated control signal.

11. The data transmission protection device according to claim 1, further comprising:

a front-end processing circuit coupled to a front end of the input clock signal detector and performing front-end processing operations on a pre-processed input clock signal.

12. The data transmission protection device according to claim 11, wherein the front-end processing circuit comprises:

a transition edge detector for detecting a transition edge of the pre-processed input clock signal to generate a first signal;

a frequency divider for dividing a frequency of the first signal to generate a second signal; and an output controller starting a timing operation according to the first signal, selecting the second signal or a previous output signal to generate a third signal according to an overflow result of the timing operation, and generating a current output signal according to the third signal based on an activation of the first signal, wherein the current output signal is transmitted to the input clock signal detector and used as the input clock signal.

13. The data transmission protection device according to claim 12, wherein the output controller comprises:

a timing circuit for timing according to a reference clock signal, starting the timing operation according to the first signal, and generating the overflow result;

a multiplexing circuit coupled to the timing circuit and the frequency divider and selecting the second signal or the previous output signal to generate the third signal according to the overflow result; and a D-type flip-flop activated by the first signal to output the third signal to generate the current output signal.

14. The data transmission protection device according to claim 13, wherein the timing circuit generates the overflow result when a period of the timing operation is greater than an overflow period, and the overflow period is equal to half of a maximum tolerable period of the input clock signal.

15. The data transmission protection device according to claim 1, wherein the control signal generator further transmits the control signal to the host end to reset the host end.

16. An electronic device, comprising:

a protected circuit; and a data transmission protection device coupled between a host end and the protected circuit, wherein the data transmission protection device comprises:

an input clock signal detector receiving a reference clock signal and detecting a frequency of an input clock signal provided by the host end according to the reference clock signal, wherein a frequency of the reference clock signal and the frequency of the input clock signal are not the same; and a control signal generator coupled to the input clock signal detector and enabling a generated control signal when the frequency of the input clock signal is greater than a safety setting value, wherein the control signal is used to disable the host end to perform a data access operation on the protected circuit.

17. The electronic device according to claim 16, wherein the control signal is a chip enable signal of the protected circuit.

18. The electronic device according to claim 16, wherein the control signal is a reset signal of the host end.

19. The electronic device according to claim 16, wherein the data transmission protection device receives a command signal and a data signal sent by the host end, and the protected circuit receives the command signal and the data signal from the host end through the data transmission protection device.

20. The electronic device according to claim 16, wherein the host end directly transmits a command signal and a data signal to the data transmission protection device and the protected circuit.

* * * * *